United States Patent
Kono et al.

(10) Patent No.: US 6,573,112 B2
(45) Date of Patent: Jun. 3, 2003

(54) SEMICONDUCTOR DEVICE MANUFACTURING METHOD

(75) Inventors: Ryuji Kono, Ibaraki-ken (JP); Akihiko Ariga, Musashimurayama (JP); Hideyuki Aoki, Takasaki (JP); Hiroyuki Ohta, Tsuchiura (JP); Yoshishige Endo, Tsuchiura (JP); Masatoshi Kanamaru, Ibaraki-ken (JP); Atsushi Hosogane, Ibaraki-ken (JP); Shinji Tanaka, Ushiku (JP); Naoto Ban, Sagamihara (JP); Hideo Miura, Koshigaya (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/238,690

(22) Filed: Sep. 11, 2002

(65) Prior Publication Data

US 2003/0027365 A1 Feb. 6, 2003

Related U.S. Application Data

(62) Division of application No. 09/396,732, filed on Sep. 15, 1999, now Pat. No. 6,479,305.

(30) Foreign Application Priority Data

Sep. 18, 1998 (JP) ............................................. 10-264413

(51) Int. Cl.[7] .............................................. H01L 21/66
(52) U.S. Cl. ............................... 438/14; 438/15; 437/8; 371/22.1
(58) Field of Search .............................. 438/14, 15, 16; 437/8; 371/22.1

(56) References Cited

U.S. PATENT DOCUMENTS

| 5,453,991 A | 9/1995 | Suzuki et al. ............... 371/22.1 |
| 5,489,538 A | 2/1996 | Rostoker et al. ............... 437/8 |

FOREIGN PATENT DOCUMENTS

| JP | 63-204621 | 8/1988 |
| JP | 3-131048 | 6/1991 |

OTHER PUBLICATIONS

P. Van Sant, Microchip Fabrication, Third Edition, 1997, p. 578.

*Primary Examiner*—John F. Niebling
*Assistant Examiner*—Olivia T Luk
(74) *Attorney, Agent, or Firm*—Mattingly, Stanger & Malur, P.C.

(57) ABSTRACT

Semiconductor device chips manufacturing and inspecting method is disclosed in which a semiconductor wafer is cut into individual LSI chips. The LSI chips are rearranged and integrated into a predetermined number. The cut LSI chips are integrated in a jig having openings with a size commensurate with the dimensions of the LSI chip. At least one part of the jig having such openings has a coefficient of thermal expansion that is approximately equal to that of the LSI chips. The integrated predetermined number of chips are subjected to an inspection process in a subsequent inspection step thereby improving efficiency and reducing cost.

10 Claims, 12 Drawing Sheets

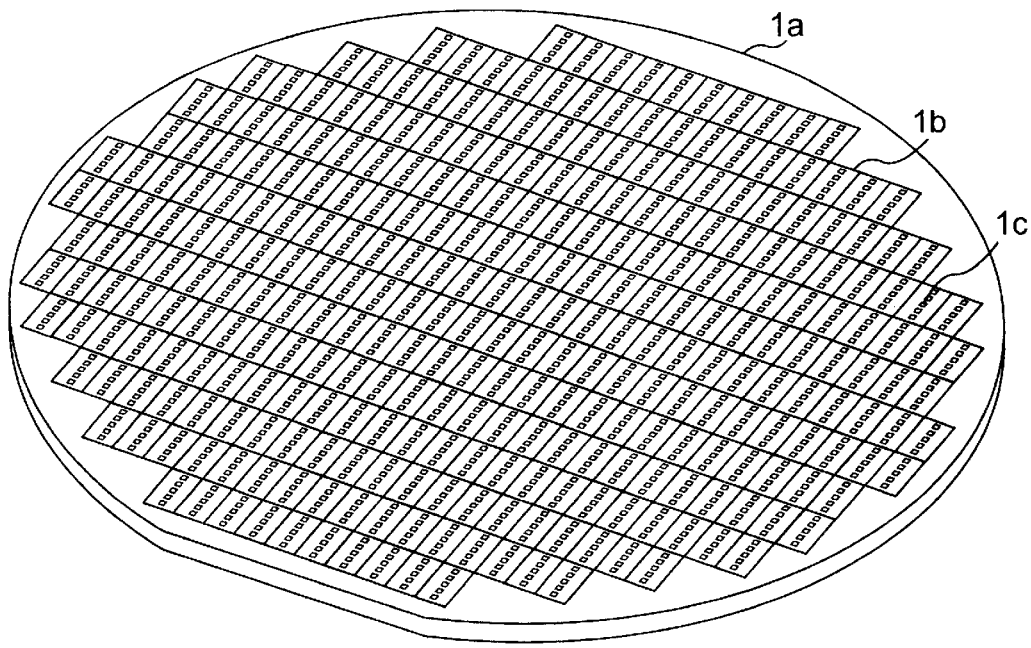
FIG. 14(a)
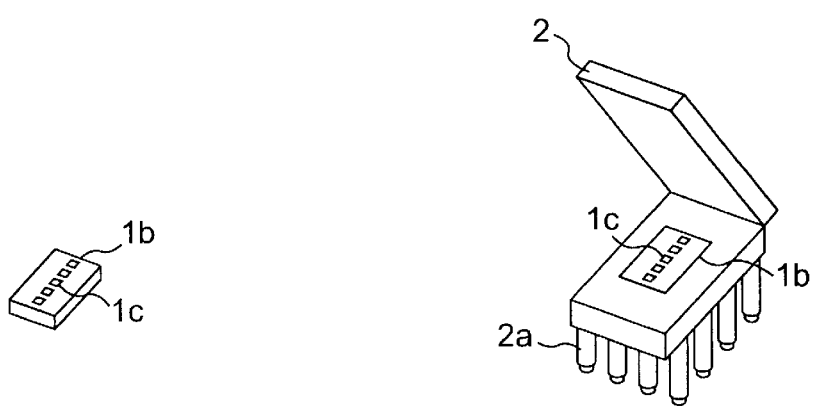
FIG. 14(b)     FIG. 14(c)

SEMICONDUCTOR DEVICE MANUFACTURING METHOD

This is a divisional application of U.S. Ser. No. 09/396,732, filed Sep. 15, 1999 now U.S. Pat. No. 6,479,305.

BACKGROUND OF THE INVENTION

The present invention relates to a semiconductor device manufacturing method including an inspection step for inspecting the circuit elements of manufactured semiconductor devices and, more particularly, to a semiconductor device manufacturing method or a semiconductor device inspecting method which is suited to make the inspection step simple and efficient and to a jig for use in such methods.

First of all, a conventional semiconductor device manufacturing method will be described below with reference to FIGS. 13 and 14 attached hereto. FIG. 13 is a flowchart schematically showing a representative semiconductor device manufacturing method, particularly, the portion of a manufacturing process including an inspection step according to the present invention. FIGS. 14(a) to 14(c) show various forms of semiconductor devices manufactured in various steps of the semiconductor device manufacturing process.

Conventionally, semiconductor devices are generally manufactured by a manufacturing method including the following major steps. The sequence of the steps coincides with the sequence described below.

(1) Previous Step

The previous step is the step of forming a multiplicity of LSI (large-scale integrated circuit) chips 1b formed by integrating a multiplicity of circuit elements over a semiconductor wafer 1a.

(2) Probing Inspection Step

The probing inspection step is the step of carrying out so-called initial screening of the multiplicity of LSIs formed over the semiconductor wafer 1a in the above-described step (1) by using probes on a chip-by-chip basis, to determine whether each of the LSIs is defective or nondefective.

(3) Cutting Step

The semiconductor wafer 1a over which the LSIs are formed in the above-described step (1) is normally cut and separated into the individual chips 1b by using, for example, a laser beam or a dicer.

(4) Mounting or Packaging Step

The mounting or packaging step is the step of mounting each of the chips 1b obtained in the above-described step (3) on a so-called socket 2 or causing each chip-shaped electrode pad to independently conduct to a leadframe so that the chips 1b can be adapted to the subsequent steps (inspection steps), and then packaging them with resin or the like, thereby forming objects to be inspected in the subsequent inspection steps.

(5) Burn-in Step

The burn-in step is the step of imparting electrical or thermal stress to a plurality of objects to be inspected, which have been obtained in the above-described step (4), at the same time for a long period of time, thereby accelerating and screening out potential defects in the manufactured LSI chips 1b.

(6) Screening Inspection Step

The screening inspection step is the final inspection step which are performed on the reliability of semiconductor devices after the above-described steps (1) to (5).

In each of the above-described probing inspection, burn-in and screening inspection steps, probes which are disposed to positionally and dimensionally correspond to predetermined electrode pads 1c formed on the semiconductor wafer 1a or the chips 1b are brought into contact with the electrode pads 1c, and each of the electrode pads 1c is made to independently conduct to an inspection system which is not shown, thereby carrying out a predetermined inspection.

However, as is also apparent from the above description, the above-described initial probing inspection step is performed with the semiconductor wafer 1a over which the multiplicity of LSI chips 1b are formed, as shown in FIG. 14(a). On the other hand, in the subsequent inspection steps including the burn-in step, it is common practice that these steps are performed with the LSI chips 1b obtained by cutting the LSIs of the semiconductor wafer 1a into chips, as shown in FIG. 14(b).

More specifically, during each of the inspection steps executed after the LSI chips 1b are cut out from the semiconductor wafer 1a, the respective LSI chips 1b are individually mounted on the sockets 2, as shown in FIG. 14(c), and the sockets 2 are individually mounted via pins 2a on a board (not shown) which conforms to the specifications of an inspection step being executed, and then the board on which the LSI chips are installed is mounted in an inspection system, whereby a predetermined electrical connection is provided and a predetermined inspection is carried out.

Incidentally, an example in which, unlike the above-described steps, the plurality of chips 1b separated by cutting are directly mounted on an inspection board without using the above-described type of socket 2 is described in, for example, Japanese Patent Laid-Open No. 131048/1991. Another example in which a wafer itself is subjected to burn-in without being cut into chips is described in, for example, Japanese Patent Laid-Open No. 204621/1988.

SUMMARY OF THE INVENTION

However, the above-described prior art has the following problems.

First, in the semiconductor device manufacturing method according to the prior art described above with reference to FIGS. 13 and 14, the respective chips 1b cut out from the semiconductor wafer 1a need to be mounted on the sockets 2, i.e., one chip to be inspected needs to be mounted on one socket.

For this reason, the number of time-consuming steps for mounting and removing separate chips to be inspected in and from sockets increases, and if electrical conduction is to be provided between the chips to be inspected and the sockets, predetermined operations and costs will occur. If the inspection costs of semiconductor devices are to be reduced by preventing the operations and costs for such electrical conduction from being caused by initial defective chips, it is necessary to carry out a probing inspection before the chips to be inspected are mounted in the sockets, as shown in the flowchart of FIG. 13, thereby eliminating the initial defective chips before the cutting step. However, this results in the problem that the number of inspection steps increases and inspection costs also increase.

In addition, as described in the above-cited Japanese Patent Laid-Open No. 131048/1991 as well, if an inspection is to be carried out with chips to be inspected being directly mounted on the inspection board, it is necessary to prepare a microprobe group in which a plurality of probes are disposed on the board itself in an arrangement corresponding to the arrangement of fine electrode pads on the surfaces of small chips to be inspected. However, the production of such microprobe group is expensive, and if chips to be inspected are various in kind (shape or dimension), a multiplicity of expensive microprobe groups need to be prepared for such various kinds of chips. This will lead to great equipment costs and hence increases in inspection costs.

Furthermore, as is known from the above-cited Japanese Patent Laid-Open No. 204621/1988, in the method of subjecting manufactured LSI chips to burn-in in the wafer state thereof, the number of electrodes to collectively electrically conduct to an inspection system is huge because recent large-diameter wafers have a multiplicity of LSIs. For this reason, the microprobe group required to connect the LSI chips to an inspection board to carry out burn-in in the wafer state is difficult to realize, and even if such a microprobe group is realized, the microprobe group becomes very expensive and requires huge equipment costs, and inspection costs likewise increase. In addition, if a huge number of electrodes are connected, the number of the electrodes may exceed the processing capability of the inspection system. Furthermore, there is the problem that the amount of deviation of the relative position between the probes and the electrode pads on a wafer due to thermal expansion increases in the outer circumferential portion of the wafer, so that both the probes and the electrode pads may become unable to physically contact each other.

Therefore, in view of the problems of the above-described prior art, the object of the present invention is to provide a semiconductor device manufacturing method and a semiconductor device inspection method both of which can solve the problems of the above-described prior art and hence can be inexpensively realized and can also guarantee high reliability, and a semiconductor device manufactured by the manufacturing method, as well as a jig for use in the manufacturing method or the inspection method.

To achieve the above object, according to the present invention, there is provided a semiconductor device manufacturing method comprising the steps of: forming a plurality of large-scale integrated circuits (LSI) over a semiconductor wafer; cutting the semiconductor wafer into individual LSI chips; rearranging and integrating a predetermined number N of cut LSI chips from among the cut LSI chips; inspecting the cut LSI chips, and screening to select LSI chips basis on an inspection result obtained in said inspecting step.

In addition, to achieve the above object, according to the present invention, there is provided a semiconductor device inspection method of inspecting semiconductor device chips obtained by forming a plurality of large-scale integrated circuits over the semiconductor wafer and cutting the semiconductor wafer into individual LSI chips, which comprising the steps of: rearranging said cut LSI chips and integrating a predetermined number N of LSI chips; inspecting said number N of cut LSI chips; and screening to select LSI chips basis on an inspection result obtained in said inspecting step.

Incidentally, according to the present invention, the jig to be used in this semiconductor device manufacturing method or semiconductor device inspection method formed of a material whose coefficient of thermal expansion is approximately equal to the LSI chips, and an accommodating portion for rearranging the predetermined number N of cut LSI chips is formed in part of said jig.

BRIEF DESCRIPTION OF THE DRAWINGS

FIG. 14 A perspective view showing a plurality of forms of a semiconductor device in the process of the semiconductor device manufacturing method according to the prior art.

DESCRIPTION OF THE PREFERRED EMBODIMENTS

Embodiments of the present invention will be described below in detail with reference to the accompanying drawings.

Figure 1:
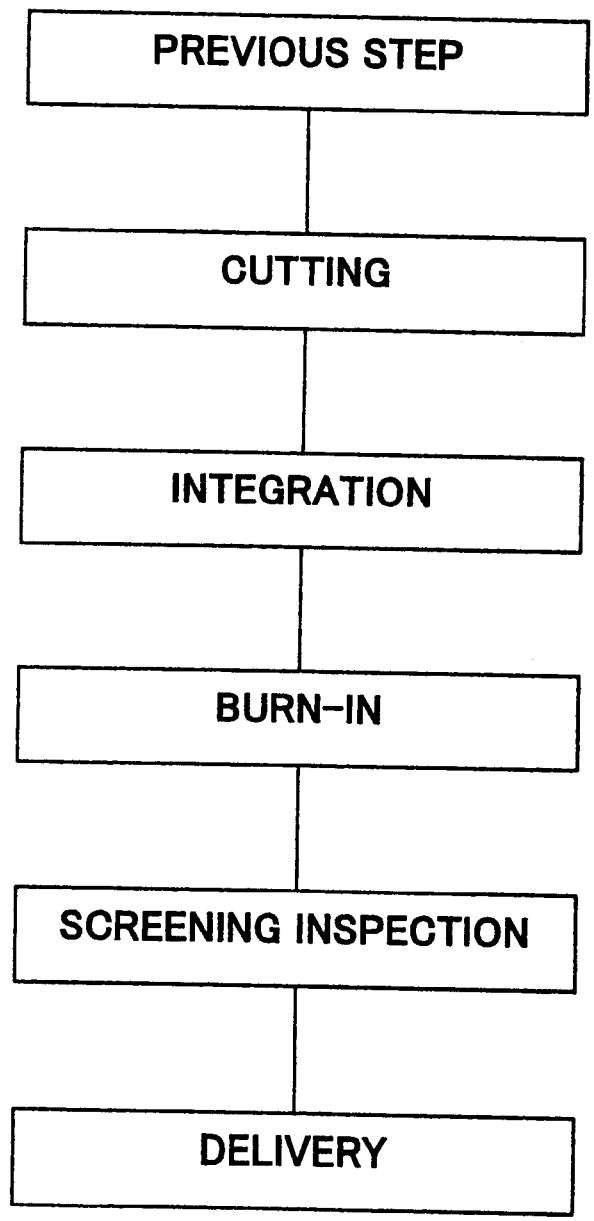
FIG. 1 A flowchart schematically showing the process of a semiconductor device manufacturing method according to one embodiment of the present invention.
Figure 2A:
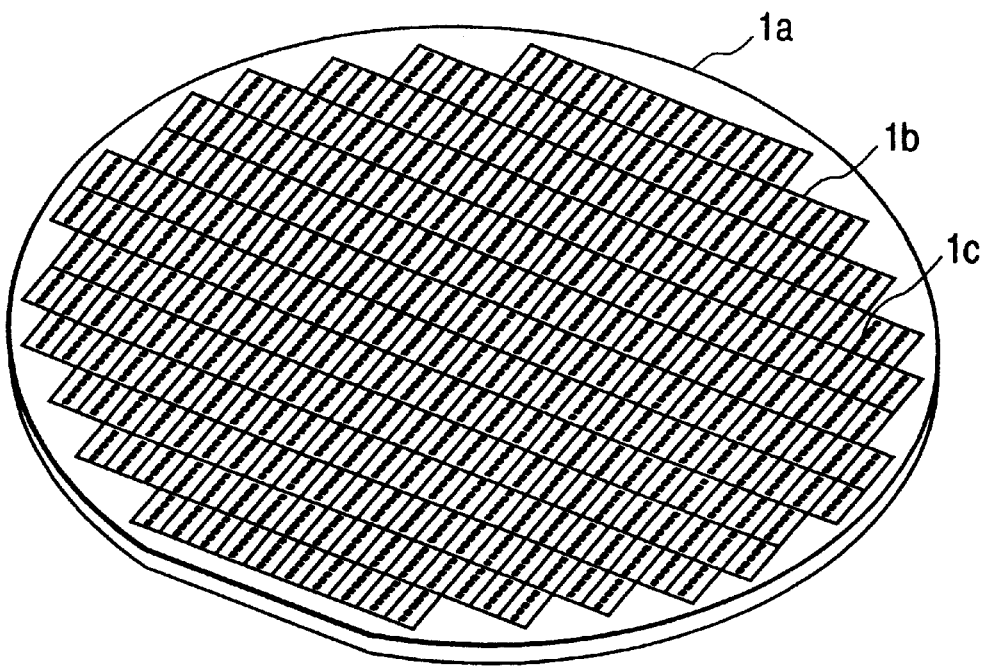
FIG. 2 A perspective view showing the form of semiconductor devices in the process of the semiconductor device manufacturing method according to the present invention, i.e., the state of a wafer and the state of a chip cut out from the wafer.
Figure 2B:
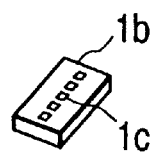

FIG. 1 of the accompanying drawings is a flowchart schematically showing the process of a semiconductor device manufacturing method (inclusive of a semiconductor device inspection method) according to one embodiment of the present invention. FIGS. 2(a) and 2(b) show forms of semiconductor devices in the manufacturing method. In the semiconductor device manufacturing method of the present invention, the following steps are carried out in the following sequence.

(1) Previous Step
(2) Cutting Step
(3) Integration Step (4) Burn-in Step (5) Screening Inspection Step The details of each of the steps in the manufacturing method will be described below.

(1) Previous Step

The previous step referred to hereinafter is the step of forming a multiplicity of LSI (large-scale integrated circuit) chips 1b each of which is formed by integrating a multiplicity of circuit elements over a semiconductor wafer 1a (refer to FIG. 2(a)) in a manner similar to the above-described one, and is comprised of a known wafer process system provided with a diffusion system, a photolithographic system, an epitaxial growth system and the like.

The formation of the LSI chips 1b in the previous step is performed by passing the semiconductor wafer 1a, which is obtained by slicing a wafer off an ingot of single-crystal silicon (Si) and performing surface-polishing of the wafer, through a multiplicity of unit steps according to the specifications of LSIs (large-scale integrated circuits) to be manufactured. Although the details of the unit steps are not described herein because none of them directly relates to the present invention, for example, general C-MOSs (Complementary Metal Oxide Semiconductors) are formed through major steps such as a step (apparatus) for forming p- and n-type portions in the substrate of the semiconductor wafer 1a, an element isolating step (apparatus), a gate forming step (apparatus), a source/drain forming step (apparatus), a wiring step (apparatus) and a protective film forming step (apparatus).

The previous step will be described below in more detail. In the step for forming p- and n-type portions in the substrate of the semiconductor wafer 1a, after boron (B) or phosphorus (P) is ion-implanted into a surface of the semiconductor wafer 1a, the implanted ions are spread over the surface by diffusion.

In the element isolating step, an Si oxide film is formed over the surface of the semiconductor wafer 1a and is then subjected to nitride film patterning for region selection, and the oxide film of a portion which is not patterned is made to selectively grow, thereby isolating individual fine elements.

In the gate forming step, a gate oxide film of approximately several nm thickness is formed between the individual elements, and a polysilicon (poly-Si) layer is deposited over the gate oxide film by a CVD (Chemical Vapor Deposition) method. After that, the deposited layer is processed in accordance with predetermined dimensions, thereby forming so-called gate electrodes.

In the source/drain forming step, after the formation of the gate electrodes, impurities such as P and B are ion-implanted and a source/drain diffusion layer is formed by activation annealing.

In the wiring step, aluminum (Al) interconnect lines and interlayer isolation films are stacked to electrically connect the above-described isolated elements.

In the protective film forming step, a protective film for preventing external impurities or water from entering the fine elements formed over the semiconductor wafer 1a in the above-described manner and, in addition, protecting the LSIs from mechanical stress during a subsequent step for packaging the circuits of the chips is formed over the surfaces of the circuits.

Incidentally, the dimensions of one wafer 1a used in the above-described steps are approximately several hundred $\mu$m in thickness and approximately 6–12 inches in diameter, and in the case of, for example, a DRAM (Dynamic Random Access Memory), approximately 400–800 LSI chips are formed over the surface of the one wafer 1a through the above-described manufacturing steps.

During this state, the above-described wafer 1a exhibits the form shown in FIG. 2(a). Each of the formed LSI chips 1b has sides of, for example, approximately several to several tens of mm length, and is provided with several tens of to several hundred electrode pads 1c. The surface of each of the electrode pads 1c is formed as a square having sides of several tens of $\mu$m length.

Figure 13:
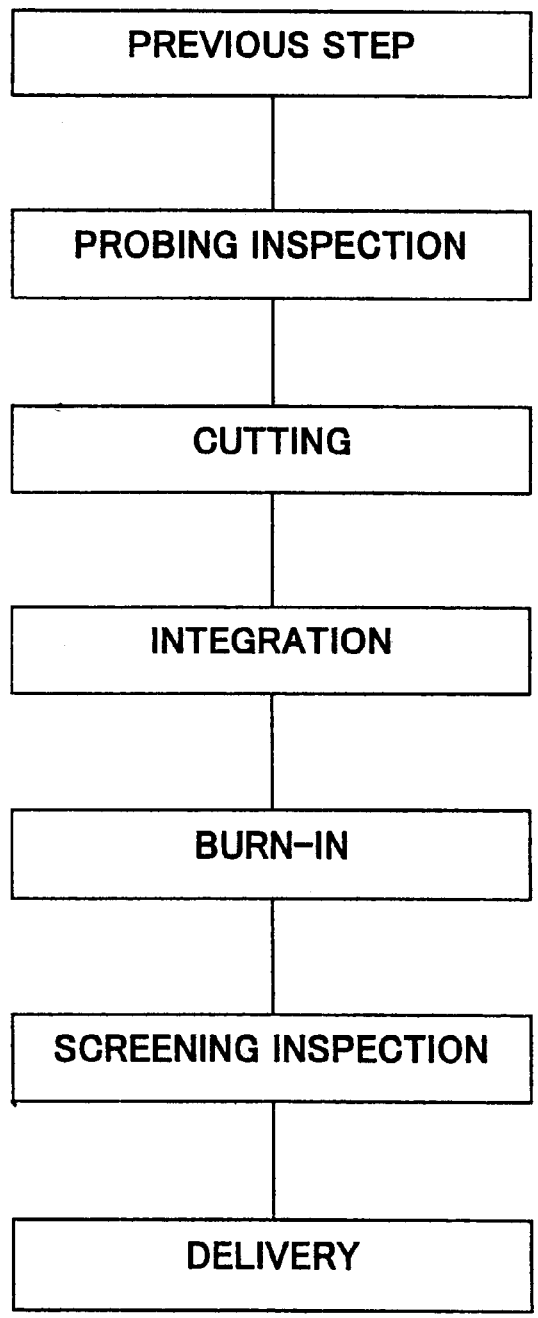
FIG. 13 A flowchart schematically showing one example of the process of a semiconductor device manufacturing method according to a prior art.

It is to be noted here that subsequently to the previous step (1) described previous in detail, the step of cutting the semiconductor wafer 1a over which the LSIs are formed is performed without performing the conventional initial probing inspection (refer to FIG. 13).

(2) Cutting Step

The cutting step is the step of cutting the LSIs formed in the above-described step (1) into the individual LSI chips 1b. Consequently, each of the LSI chips 1b cut into individual chips exhibits the form shown in FIG. 2(b). Then, according to the present invention, an integration step which will be described below is performed subsequently to the cutting step (2).

(3) Integration Step

The integration step is a step which makes it possible to integrally handle only a predetermined number N of LSI chips 1b from among the plurality of LSI chips 1b separated by cutting in the above-described step (2), in each of subsequent burn-in and screening inspection steps as if the predetermined number N of LSI chips 1b were a silicon wafer. That is to say, the integration step serves to rearrange the predetermined number N of LSI chips 1b with high precision and confine the relative position therebetween. Incidentally, the predetermined number N is a natural number not less than two and is less than the number of LSI chips 1b to be cut out from one silicon wafer 1a.

Figure 3:
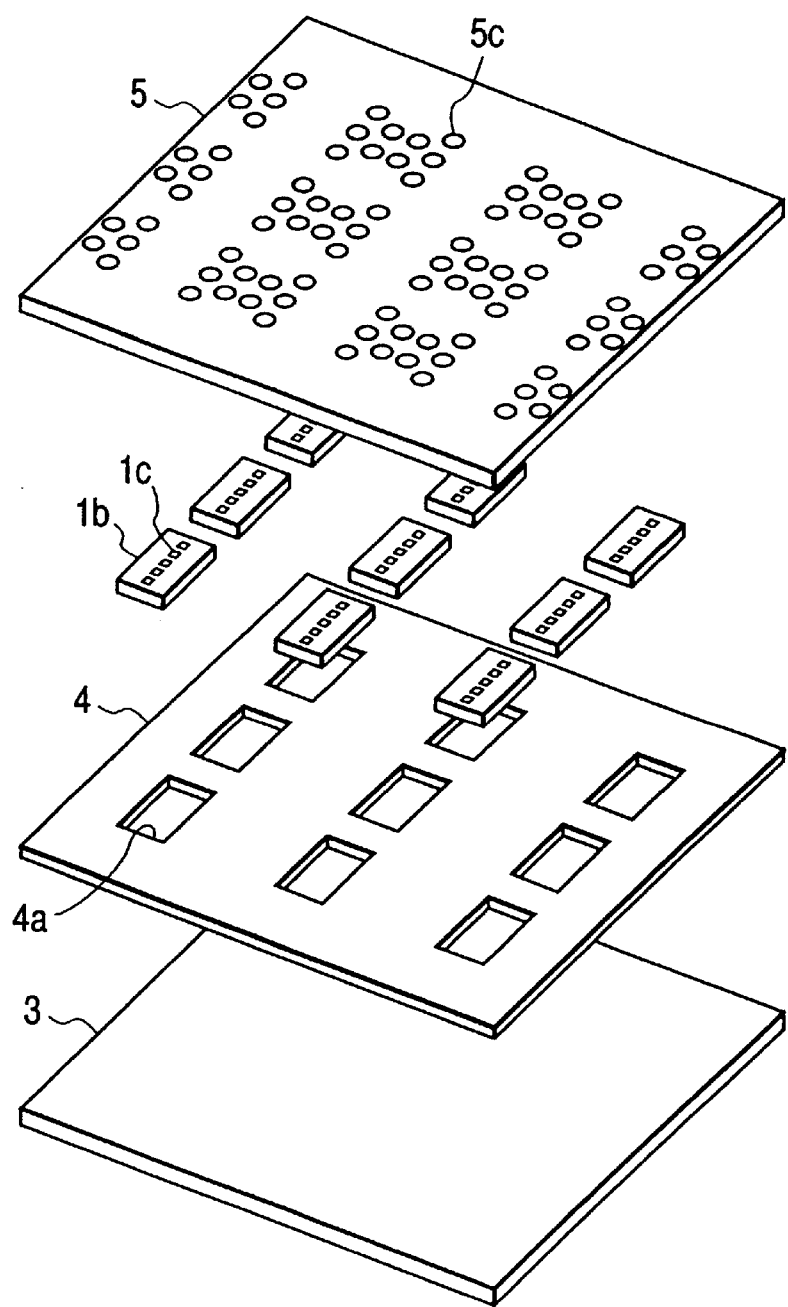
FIG. 3 An exploded perspective view showing a specific construction of an integration structure to be used in the semiconductor device manufacturing method according to the present invention.
Figure 4:
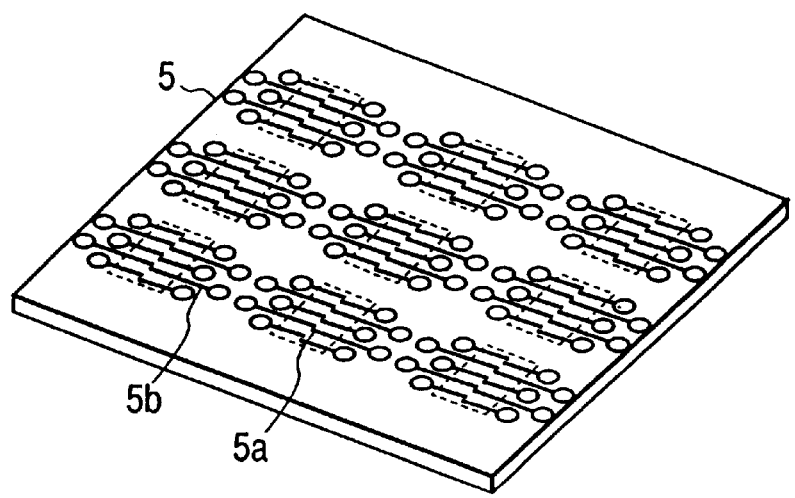
FIG. 4 A perspective view showing the structure of the integration structure, particularly, the structure of the reverse surface of a contactor.

A specific form of the integration step will be described below with reference to FIGS. 3 to 6. FIG. 3 is an exploded perspective view of one example of an integration structure which is the above-described integration means (a jig for integration), and FIG. 4 shows the reverse surface of a contactor of the integration structure, as will be described later.

First, as shown in FIG. 3, the predetermined number (in this example, 9) of LSI chips 1b are installed on a plate-shaped base 3 so that they are rearranged with high precision. Incidentally, the base 3 on which these LSI chips 1b are installed is formed of Si which is the same material as the LSI chips 1b, or a metal or a ceramic (for example, aluminum nitride) whose coefficient of thermal expansion approximates that of the base 3.

A tray 4 in which the aforesaid predetermined number (9) of openings 4a are formed is disposed on the top surface of the base 3. This tray 4 is also formed of Si which is the same material as the LSI chips 1b, or a metal or a ceramic (for example, aluminum nitride) whose coefficient of thermal expansion approximates that of the tray 4. The openings 4a are formed at positions at which to arrange the aforesaid predetermined number (9) of LSI chips 1b, and with a size commensurate with the dimensions of each of the LSI chips 1b. With this constitution, by inserting the LSI chips 1b separated by cutting into the respective openings 4a of the tray 4, it is possible to rearrange the aforesaid predetermined number (9) of LSI chips 1b with high precision after the cutting and separating step.

In this case, it is particularly preferable that the tray 4 be formed of Si which is the same material as the LSI chips 1b, as described above, because the following merits are obtained.

(1) By using anisotropic etching to process the openings 4a, the side faces of each of the openings 4a are naturally obliquely formed to have predetermined angles, as shown in FIG. 3 (further, FIGS. 6 and 7), thereby facilitating the operation of fitting or removing the LSI chips 1b into or from the openings 4a.

(2) In addition, by using a known etching art as a micromachining method, it is possible to process the shapes of the openings 4a and the like with very high precision, whereby it is possible to realize high-precision rearrangement of the LSI chips 1b after the cutting and separating step.

(3) Furthermore, since both the tray 4 and the LSI chips 1b are made the same in coefficient of thermal expansion, particularly, since both are formed of the same material (Si), the coefficient of thermal expansion becomes a very small value of approximately $3\times10^{-6}/°$ C., whereby even if the temperatures of both vary, the difference in dimension between the openings 4a and the LSI chips 1b hardly varies and a variation in the relative positions between the rearranged LSI chips 1b is kept very small.

Referring back to FIG. 3, after the LSI chips 1b separated by cutting have been rearranged with high precision by being inserted into the respective openings 4a of the tray 4, a plate-shaped contactor 5 is arranged to cover the top of the tray 4. FIG. 4 shows the state in which the contactor 5 is turned upside down (or the state of the bottom of the contactor 5 as viewed from the reverse side thereof).

Figure 6:
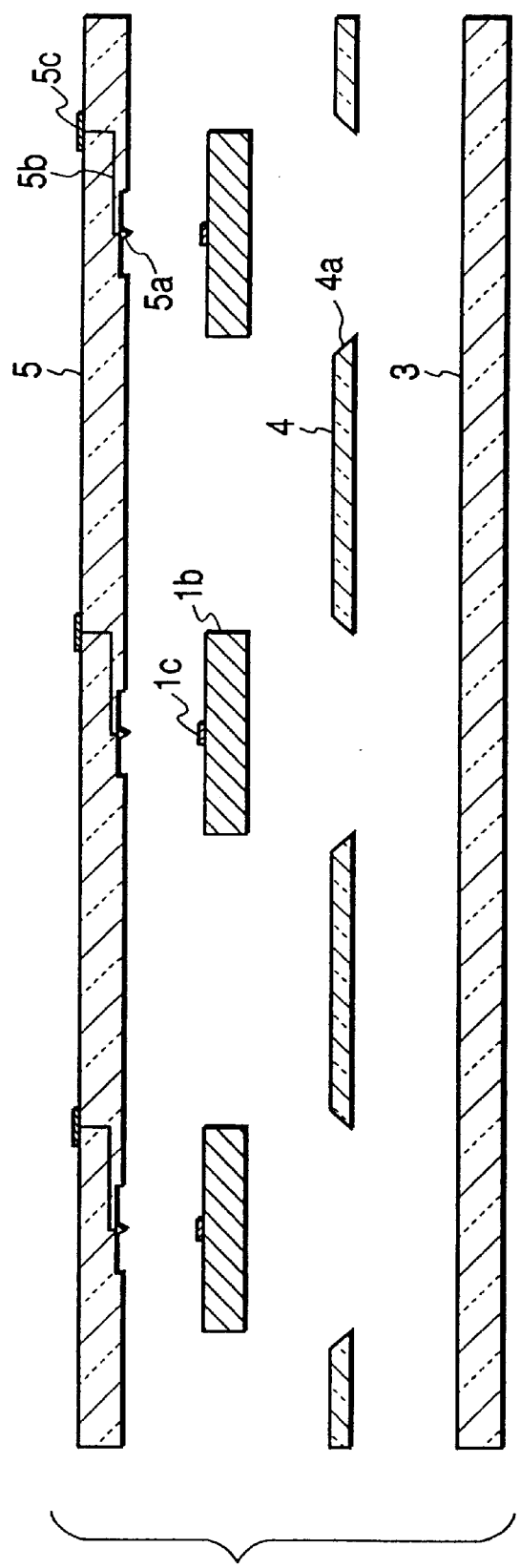
FIG. 6 A cross-sectional view showing in exploded form the integration structure and the plurality of chips rearranged in the interior of the integration structure.
Figure 7:
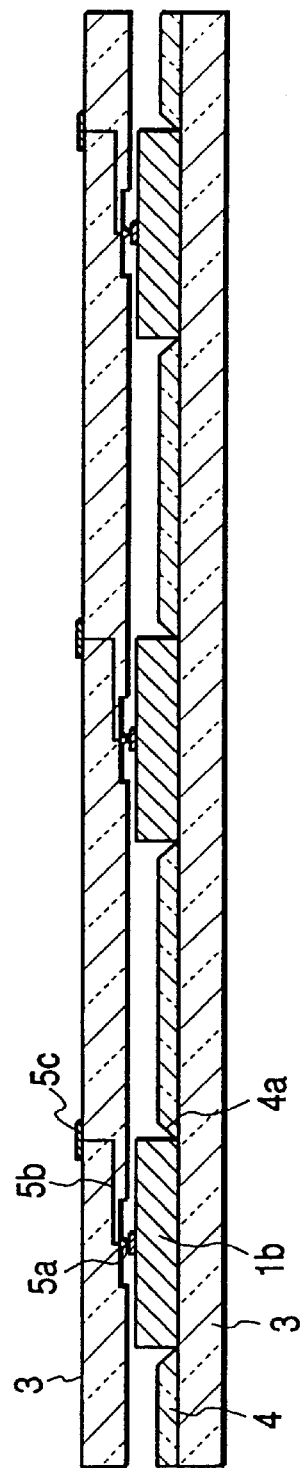
FIG. 7 A cross-sectional view showing the state of the plurality of chips rearranged and integrated in the interior of the integration structure by the integration structure.

As is also apparent from FIG. 4, the contactor 5 has projection-like probe portions 5a on its reverse surface at positions which correspond to (coincide with) electrode pads 1c of the respective chips inserted and installed in the openings 4a of the tray 4 (for more details, refer to the cross-sectional views shown in FIGS. 6 and 7). The reverse surface of the contactor 5 having the probe portions 5a is forced against the obverse surfaces of the LSI chips 1b while a predetermined load is being applied to the LSI-circuit-formed surfaces of the above-described installed LSI chips 1b. Incidentally, in this case, particularly when there is a difference (nonuniformity) in thickness or the like between the chips 1b inserted in the openings 4a of the tray 4, the difference in thickness is effectively absorbed by disposing elastic elements such as coil springs or elastomers at positions of the base 3 at which to install the chips 1b.

Secondary electrodes 5c which electrically conduct to each of the probe portions 5a via fine interconnect lines 5b formed to extend through the interior of the contactor 5 are disposed on the surface of the contactor 5 opposite to the surface on which the probe portions 5a are formed (i.e., the top surface of the contactor 5: refer to the contactor 5 shown in FIG. 3). Accordingly, in this stage in which the contactor 5 is placed over the chips 1b, each of the electrode pads 1c on the LSI chips 1b conducts to the corresponding secondary electrodes 5c on the top surface of the contactor 5 placed, and at the same time, the relative positions of the plurality of chips 1b installed on the same base 3 are confined with high precision.

Incidentally, in the above-described structure of the contactor 5, in order to electrically connect the probe portions 5a (the reverse surface) and the secondary electrodes 5c (the obverse surface) which are located on the mutually opposite surfaces, the above-described interconnect lines 5b need to extend through the interior of the contactor 5. In the present embodiment, this constitution is achieved by opening through-holes in the contactor 5 and metallizing the interiors of the through-holes to connect the interconnect lines on both surfaces (through-holes). However, such structure is not limiting, and it is also possible to dispose interconnect lines across both surfaces of the contactor 5 and electrically connect the probe portions 5a (the reverse surface) and the secondary electrodes 5c (the obverse surface).

Similarly to the tray 4 or the like, this contactor 5 is desirably formed of Si which is the same material as the LSI chips 1b, or a metal or a ceramic (for example, aluminum nitride) whose coefficient of thermal expansion approximates that of the contactor 5. In particular, if the Si material is used, the following merits are obtained.

(1) By using a known wiring art as a wafer process which is an LSI manufacturing technique, it is possible to apply very fine and highly precise wiring and electrode processing to the contactor 5.

(2) In particular, according to a micromachining method, extremely highly precise projections or the like can be formed on either surface of the contactor 5, and such projections can be used as the cores of the probe portions 5a. Furthermore, although not shown, various processes can readily be applied to the contactor 5; for example, the thickness of the base material of the contactor 5 is locally reduced in the vicinity of each portion in which the probe portions 5a are formed, or through-slits are formed between adjacent ones of the probe portions 5a. Incidentally, such a process applied to the contactor 5 provides useful effects such as enabling the individual probe portions 5a to be independently displaceable, particularly when the contactor 5 is forced against the base 3 from above the LSI chips 1b which are inserted in the openings 4a of the tray 4 and rearranged with high precision. For example, even if a plurality (multiplicity) of probe portions 5a are formed to different (nonuniform) heights on the reverse surface of the contactor 5, the process can provide the effect of absorbing the difference in height between the probe portions 5a.

(3) Since the chips 1b and the tray 4 are made the same in coefficient of thermal expansion, even if a temperature variation occurs between the chips 1b and the tray 4, it is possible to prevent movement (deviation) of the relative in-plane position between the chips 1b and the probe portions 5a.

However, if none of the probe portions 5a, the secondary electrodes 5c and the interconnect lines 5b is required to have particularly high precision, it may also be possible to form the contactor 5 by using, for example, a glass epoxy, a ceramic or an organic thin film such as polyimide, instead of the above-described materials. In addition, in the structure of the above-described integration structure, it is also possible to use a structure in which the base 3 and the tray 4 are integrated in advance, i.e., spot faces (recesses) which coincide with the arrangement positions and dimensions of the plurality of chips 1b to be rearranged are formed at predetermined positions on the surface of the base 3.

Figure 5:
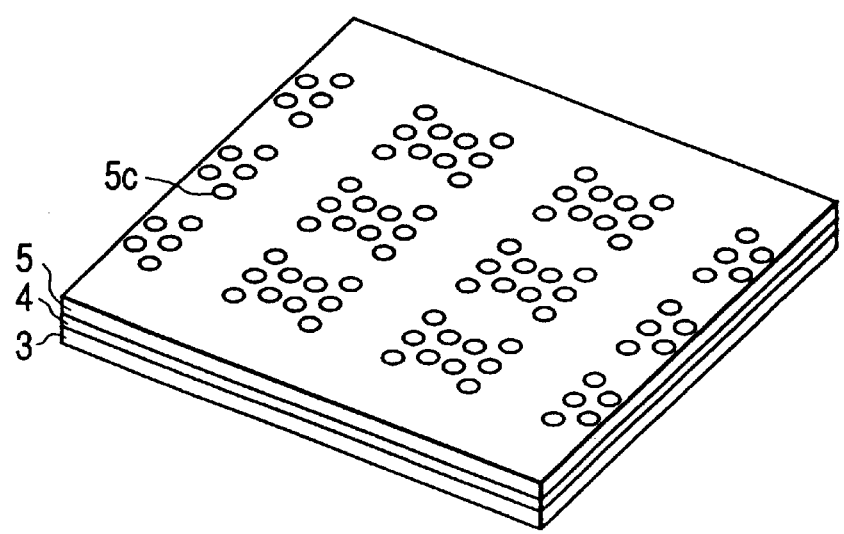
FIG. 5 A perspective view showing the state in which a plurality of chips are integrated by the integration structure.

FIG. 5 is a perspective view showing the state in which the predetermined number N (in this example, 9) of LSI chips 1b are integrated in a highly precisely rearranged state in the above-described integration structure after the cutting and separating step, FIG. 6 is an exploded cross-sectional view showing the integration structure, and FIG. 7 is a cross-sectional view showing the integrated state of the integration structure.

Specifically, in the integration structure according to the present invention in which the above-described predetermined number N of LSI chips 1b are rearranged and integrated, (1) the relative positions between the chips 1b are confined with high precision by the base 3, the tray 4 and the contactor 5 of the integration structure (it is a matter of course that, although not shown, for example, securing means using a mechanical load such as screwing or another pressing mechanism using force such as magnetic force or atmospheric pressure is disposed for that purpose, particularly, to secure the base 3 and the contactor 5 to each other).

(2) The electrode pads 1c of the predetermined number N of LSI chips 1b which are disposed in the interior of the integration structure are respectively exposed as the secondary electrodes 5c on the surface of the integration structure (particularly, the surface of the contactor 5).

In other words, the above (1) and (2) indicate that the present integration structure does not differ from the above-described semiconductor wafer 1a in terms of the function of an object to be inspected in a burn-in or screening inspection step which will be carried out later.

Contrarily, the above-described integration structure and the semiconductor wafer 1a differ from each other in the following points.

(1) The chips 1b separated by cutting are rearranged in the integration structure at certain space intervals.

(2) The number of the LSI chips 1b rearranged in the integration structure is small compared to the semiconductor wafer 1a (2<predetermined number N<total number of LSI chips of wafer 1a).

(3) The dimensions and pitch of the secondary electrodes 5c which appear on the outside of the integration structure (on the surface of the contactor 5) become large (can be made large) compared to the dimensions and pitch of the electrode pads 1c on the surface of the wafer 1a.

By utilizing such an integration structure, the following effects are obtained in each of the subsequent burn-in and screening inspection steps.

(1) In particular, the openings 4a (i.e., the above-described predetermined number N of openings) which accommodate in their interiors the respective LSI chips 1b to be rearranged in the integration structure and the contactor 5 through which to take out the electrode pads 1c of the accommodated chips 1b can be set to correspond to an adequate number (for example, in the range of about 10 to about 100), as required. With this constitution, it is possible to select a number which conforms to the processing capability of an inspection system to be used in the inspection step to be carried out later, whereby it is possible to execute optimum inspection processing. As an example, if inspection boards or the processing capabilities of inspection systems in inspection steps which have currently been conducted are considered, it will be appropriate to set the predetermined number N to, for example, 32 or 64.

(2) In particular, by utilizing the secondary electrodes 5c which appear on the outside of the integration structure (on the surface of the contactor 5) (i.e., whose dimensions and pitch are far larger than those of the electrode pads 1c), it is possible to readily and reliably carry out an operation such as the operation of providing electrical conduction between the inspection system and each LSI chips 1b which are objects to be inspected. Incidentally, it is desirable that the secondary electrodes 5c which appear on the surface of the contactor 5 be formed at a pitch of, particularly, 0.5 mm to 1.5 mm. This is intended to make it possible to readily and reliably cope with contact probes which have pitches which excel in human operability and reliability and are previously established in evaluation (for example, narrow pitch: approximately 0.5 mm, wide pitch: approximately 1.5 mm), because such contact probes are widely used as contact probes for inspection boards which are generally used for inspection.

If the formation pitch of the secondary electrodes 5c is selected to be, particularly, 0.5 mm to 1.5 mm, the following effects are also obtained. First of all, consideration will be given to the process of most densely incorporating LSI chips in the present integration structure. This is nothing else but incorporating LSI chips at as small space intervals as possible. That is to say, the process implies that the region of secondary electrodes for one chip becomes not greater than the region (≈area) of one chip. For example, since the actual areas of current DRAMs are on the order of 100 mm$^2$ and the number of electrode pads per DRAM is on the order of 100, an allowable pitch of the secondary electrodes becomes $(100 \text{ mm}^2/100)^{1/2}=1$ mm in terms of the above purpose. In other words, the fact that the formation pitch of the secondary electrodes 5c is selected to be 0.5 mm to 1.5 mm leads to the effect of making the present integration structure most efficient.

Furthermore, according to the feature of increasing the pitch and dimensions of the secondary electrodes 5c in this manner, even in a case where, for example, a glass epoxy substrate which greatly differs in coefficient of thermal expansion from the material (i.e., Si) of the chips 1b which are objects to be inspected (as well as the above-described integration structure) is used in the inspection system (particularly, a portion which provides electrical connection to the secondary electrodes 5c), even if a positional deviation between both the glass epoxy substrate and the chips 1b occurs due to a temperature difference therebetween, the problem that this positional deviation cuts off a conducting state does not occur, whereby it is possible to reliably carry out inspection of semiconductor devices.

(3) In addition, according to the feature of leaving predetermined margins for the number and the arrangement layout of the secondary electrodes 5c disposed on the surface of the contactor 5 of the integration structure, merely by altering the dimensional specifications of the integration structure, it is possible to use the same board of the inspection system in other inspections of different kinds of LSI chips 1b, so that inspection costs can also be reduced.

(4) Burn-in Step

The burn-in step is the reliability inspection step of accelerating and screening out potential defects of the chips 1b by leaving the chips 1b for a predetermined period of time while heating (imparting thermal stress to) the LSI chips 1b at approximately 100 to 150° C. and, at the same time, imparting electrical stress to the formed LSIs via the electrode pads 1c. Although the following description refers to a specific example in which the burn-in step serves as the reliability inspection step, it is apparent that the burn-in step may serve as another step for inspecting manufactured semiconductor devices.

Figure 8:
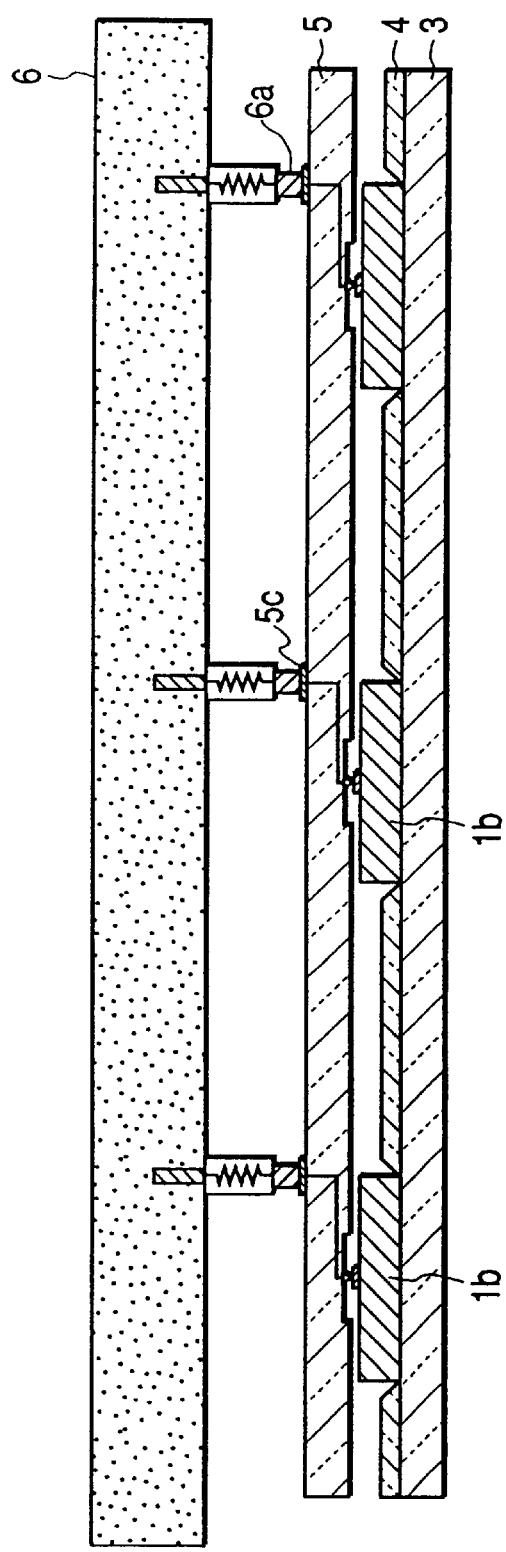
FIG. 8 A cross-sectional view showing the state in which the plurality of chips integrated by the integration structure are connected to a printed circuit board in a burn-in step.

FIG. 8 is a cross-sectional view showing the state in which the integrated plurality (predetermined number N) of LSI chips 1b in the integration structure according to the present invention are connected to a printed circuit board 6 (a board which is used for carrying out the burn-in step) in the burn-in step.

Referring to FIG. 8, the printed circuit board 6 is provided with contact probes 6a which have, for example, a wide pitch (for example, a 1.5-mm pitch), while the secondary electrodes 5c disposed on the surface of the contactor 5 of the integration structure are also formed at a similar pitch. With this constitution, by positioning the integration structure so that the contact probes 6a of the printed circuit board 6 are located at positions which coincide with the corresponding secondary electrodes 5c, it is possible to provide electrical connection between the contact probes 6a and the secondary electrodes 5c. Incidentally, the contact probes 6a are connected to a circuit inside the printed circuit board 6, and finally conducts to an inspection system which is not shown. Thus, in the above-described burn-in step, the integration structure and the printed circuit board 6 for inspection are secured to each other in this state, and the above-described thermal and electrical stresses are imparted to the integration structure. Incidentally, according to the feature of integrating the predetermined number N of chips in the integration structure, as compared with the conventional method of installing one chip in one socket, it is possible to make the volume per chip far smaller because of the structure of the integration structure, whereby in the burn-in step the number of chips insertable into a heating furnace which is heating means increases, so that inspection efficiency can be enhanced to a further extent.

(5) Screening Inspection Step

The screening inspection step is a final performance inspection step which is performed at a temperature of, for example, 25 to 75° C., and is normally performed by using an inspection system which is called a handler, on the basis of the result obtained in the above-described inspection step which is the burn-in step. Incidentally, in the screening inspection step, although not shown, the specifications of the printed circuit board and inspection system used differ from those used in the burn-in step described in the above (4), but the manner of inspection is similar to the manner of the inspection of the burn-in step: that is to say, the screening inspection step is performed by ensuring electrical conduction between the electrode pads of the LSI chips which are objects to be inspected and the inspection system. Accordingly, in this screening inspection step as well, in a manner similar to that shown in FIG. 8, screening inspection is performed on the predetermined number N of LSI chips rearranged and integrated in the integration structure.

In this manner, according to the semiconductor device manufacturing method described above in detail, after the above-described integration step of integrating only the predetermined number N of LSI chips from among a multiplicity of LSI chips separated by being cut out from a semiconductor wafer, the LSI chips are maintained in the integrated state until the above-described screening inspection step is completed. Accordingly, the result of inspection of each of the LSI chips can be managed on the basis of their arrangement positions (address) in the integration structure, and the LSI chips can be conveyed along a line between each inspection step by a conveying system mechanically similar to a conventional wafer conveying system because of the plate-like shape of the integration structure (particularly remarkably, if the integration structure has a circular shape).

Then, in the screening inspection step, only the LSI chips 1b which are finally determined as non-defective articles are picked up after they are released from the state of being integrated by the integration structure, and are delivered as, for example, reliability-guaranteed chips (KGD: Known Good Die) without being packaged.

In this manner, the above-described semiconductor device manufacturing method does not need any of the steps described previously in the description of the prior art, such as the step of mounting chips on individual sockets or the step of packaging chips with sockets, and further, no accompanying costs occur. Accordingly, it is not necessary to execute the previous step in the conventional manufacturing process (refer to FIG. 13), i.e., the preliminary probing inspection step performed after the step of forming circuit elements for LSIs over a semiconductor wafer, whereby it is possible to reduce the number of steps in the manufacture of semiconductors. However, the execution of this probing inspection step need not always be precluded, for example, if the manufacture yield of semiconductor devices is low and the manufacture efficiency thereof can be improved by executing the probing inspection step.

As described above, according to the integration structure of the present invention, after the semiconductor wafer 1a over which a multiplicity of LSIs are formed by the previous step is cut into the LSI chips 1b, only the predetermined number N of LSI chips 1b are rearranged and integrated, and are then subjected to the processing of each subsequent step. Accordingly, as compared with the prior art inspection method, particularly, the method of performing inspection with one LSI chip being mounted on one socket, the integration structure makes it possible to systematically and collectively perform inspection processing on an adequate number of LSI chips which conform to the number of processing steps of an inspection system, as if a preprocessed semiconductor wafer itself were inspected (although the integration structure differs from the semiconductor wafer in shape and the number of LSI chips). Accordingly, it is possible to provide a superior inspection system which can efficiently inspect a multiplicity of LSI chips and which, even if existing equipment is used, can efficiently carry out inspection of semiconductor devices according to the capability of the existing equipment.

According to the integration structure of the present invention, as compared with the prior art inspection method, particularly, the method of directly mounting LSI chips on an inspection board or the method of carrying out inspection of LSI chips in a wafer state, it is possible to integrally handle a plurality of LSI chips during inspection of semiconductor devices, and it is also possible to easily and reliably realize electrical conduction to an inspection system by making use of the secondary electrodes 5c (which are large compared to the electrode pads of LSI chips in the wafer state or the respective LSI chips). Accordingly, it is possible to comparatively inexpensively realize inspection of semiconductor devices without using expensive microprobes or the like.

It is to be noted that according to the integration structure of the present invention, by making it possible to inspect large quantities of LSI chips efficiently and comparatively inexpensively, as shown also in FIG. 1, it is possible to omit, particularly, an initial probing step which is the initial screening step after preprocessing which has been required in the conventional inspection method of performing inspection with one LSI chip being mounted in one socket. This is because as is also apparent from the above description, according to the semiconductor device inspection method of the present invention, it is possible to inspect large quantities of LSI chips efficiently and comparatively inexpensively and, even if defective articles are not eliminated in such initial screening step after preprocessing and are screened out in a subsequent screening step, the inspection cost thereof does not greatly increase. Furthermore, according to the semiconductor device inspection method of the present invention, as described above, it is possible to realize a far lower-cost inspection method by omitting the probing step which is the initial screening step after preprocessing which has been required in the conventional method.

The above-described integration structure is not limited to any of the embodiments described above in detail, and is intended to provide the above-described various effects and merits. Accordingly, the number, spacing and the like of the chips 1b to be rearranged over the base 3 are determined on condition that the above-described effects and merits can be satisfied, in terms of the dimensions, pitch, number and the like of the secondary electrodes 5c on the surface of the contactor 5.

The number of the LSI chips 1b to be rearranged over the base 3 of the integration structure is desirably determined on condition that the external dimensions or constraint conditions of the integration structure including the base 3 and/or the processing capability of the inspection system can be utilized to the maximum extent. Accordingly, the present integration structure is intended to provide a pseudo-wafer-like constitution having specifications changed to make subsequent inspections easy and efficient, and therefore, in each of the above-described embodiments, the external shape of the integration structure is square. However, according to the present invention, the external shape of the integration structure need not be limited to only such square shape, and as described above, can also be made circular similarly to, for example, wafers.

In the above description, reference has been made to only the example in which the secondary electrodes 5c formed on the reverse surface of the contactor 5 in the integration structure are brought into contact with the electrode pads 1c on the LSI chips 1b which are arranged in the interior of the integration structure. However, such a structure is intended to provide electrical conduction between the LSI chips 1b which are objects to be inspected and the inspection system. Accordingly, the structure need not necessarily be limited to the above-described constitution and the secondary electrodes 5c may be brought into contact with, for example, solder balls or the like provided on the LSI chips 1b.

Figure 9:
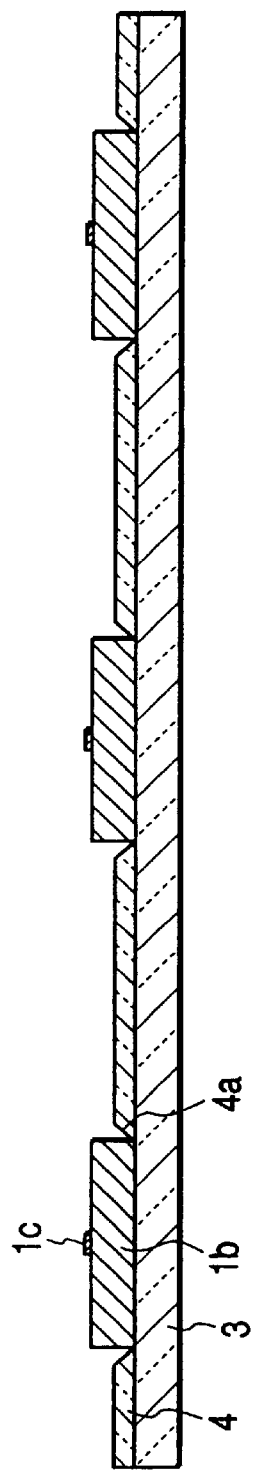
FIG. 9 A cross-sectional view showing another integration structure according to the present invention, which is different from the aforesaid integration structure, and a plurality of chips rearranged by that integration structure.

FIG. 9 is a cross-sectional view showing the state in which the LSI chips 1b are integrated by an integration structure different from the above-described one. In an example using this integration structure, its basic structure which includes the base 3, the tray 4 and the LSI chips 1b inserted and rearranged in the openings 4a formed in the tray 4 is similar to the example shown in FIGS. 6, 7 and the like. However, the structure of this example is such that the contactor 5 to be placed over the tray 4 is omitted. A method of electrically connecting electrodes to chips in a subsequent burn-in step or screening inspection step will be described below.

Figure 10:
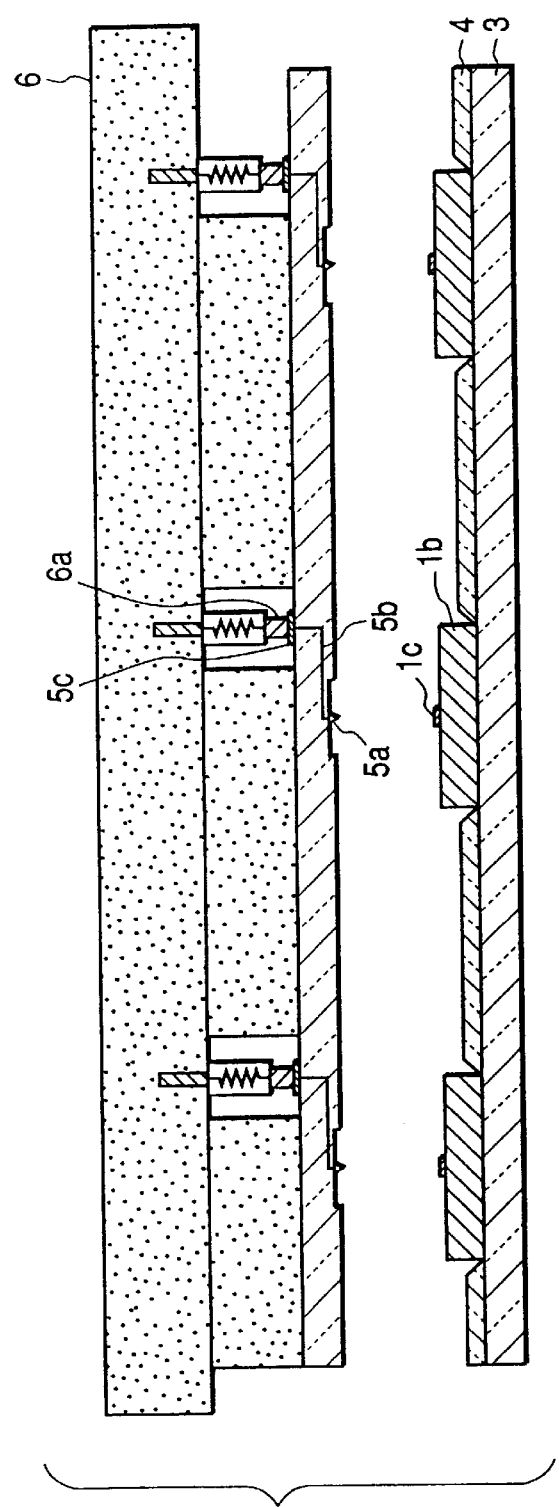
FIG. 10 A cross-sectional view showing a state immediately before the plurality of chips are rearranged and integrated and connected to a printed circuit board by the integration structure of FIG. 9.
Figure 11:
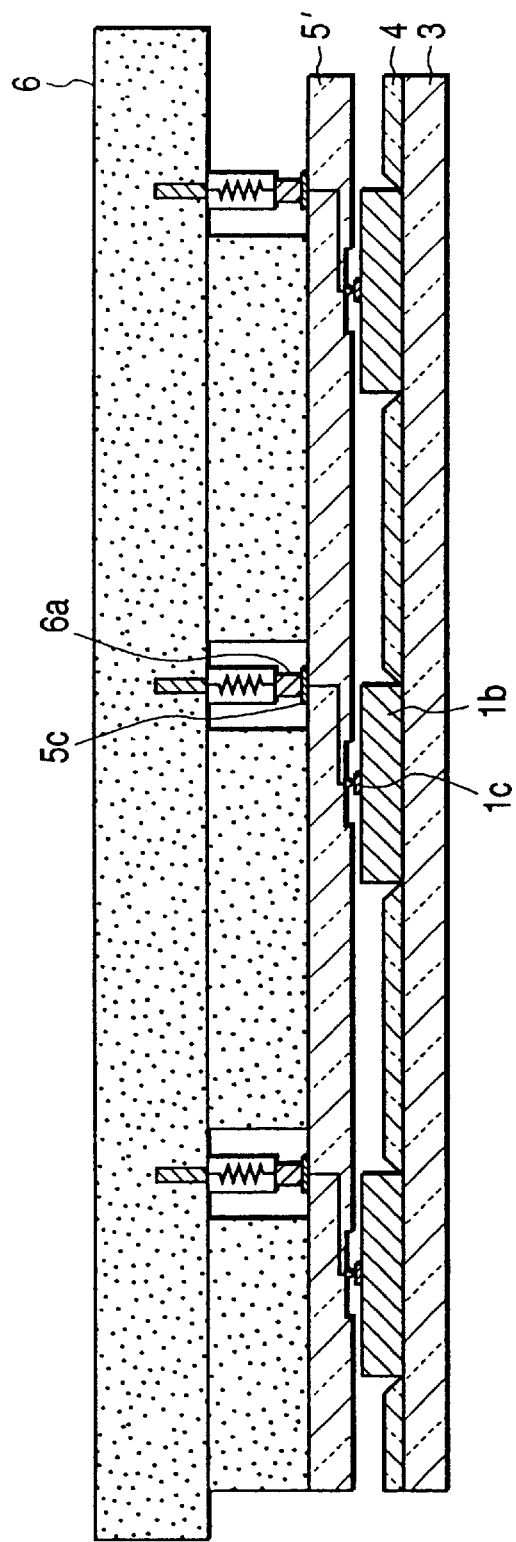
FIG. 11 A cross-sectional view showing the state after the plurality of chips are rearranged and integrated and connected to the printed circuit board by the integration structure of FIG. 9.

FIGS. 10 and 11 are cross-sectional views showing the manner in which the integration structure shown in FIG. 9 is connected to the printed circuit board 6 for the above-described burn-in step, particularly, in the burn-in step (FIG. 10 shows the manner before connection, and FIG. 11 shows the manner after connection).

As is also apparent from FIGS. 10 and 11, in this case, a board-side contact 5' which corresponds to the contactor 5 of the above-described integration structure is secured to the printed circuit board 6. The board-side contact 5' is constructed similarly to the contactor 5 shown in FIGS. 3 and 4. Specifically, a plurality of probe portions 5'a are disposed on the surface (bottom surface) of the board-side contact 5' opposed to the chips 1b, at positions corresponding to the respective electrode pads 1c of the chips 1b, and secondary electrodes 5'c are disposed on the side (top surface) of the board-side contact 5' opposed to the printed circuit board 6, at positions corresponding to the respective contact probes 6a which are projected downward from the printed circuit board 6. The board-side contact 5' may also be formed of the same material as the contactor 5.

An inspection system (not shown) is electrically connected and conducts to the predetermined number N of LSI chips 1b which are rearranged in the above-described integration structure, via the secondary electrodes 5'c, interconnect lines 5'b, the probe portions 5'a of the board-side contact 5' by means of the contact probes 6a of the printed circuit board 6, whereby predetermined inspection processing is performed. Specifically, the relative position between the integration structure and the printed circuit board 6 is fixed with the probe portions 5'a and the electrode pads 1c of the LSI chips 1b being in contact with each other, and the burn-in step is carried out by imparting temperature or electrical stress to the LSI chips 1b.

Figure 12:
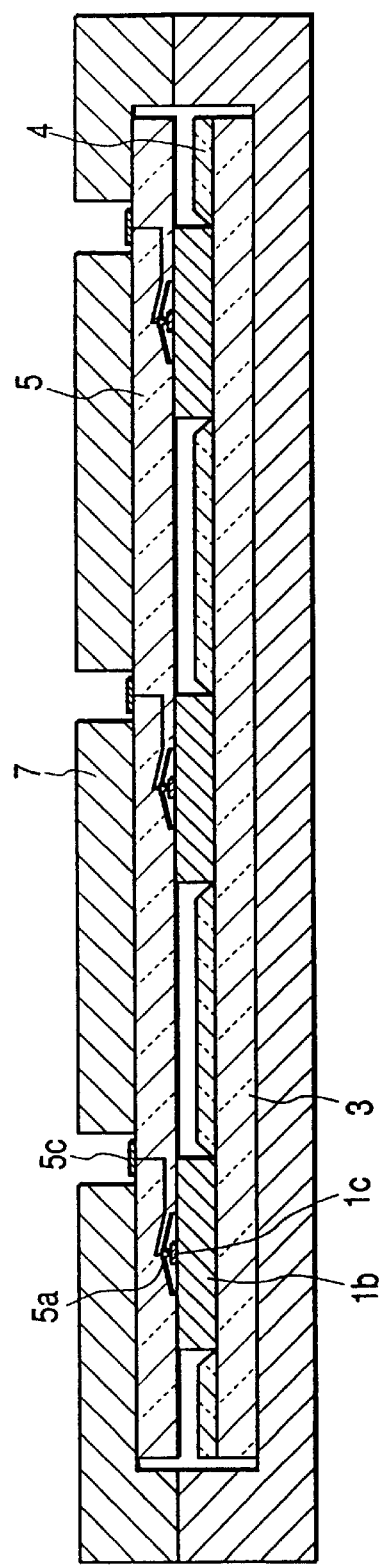
FIG. 12 A cross-sectional view showing yet another integration structure according to the present invention and a plurality of chips rearranged by the integration structure.

FIG. 12 is a cross-sectional view of the state in which the LSI chips 1b which are objects to be inspected are integrated by yet another integration structure. In this example, its basic structure which includes the base 3, the tray 4 and the contactor 5, for rearranging and integrating the LSI chips 1b in its interior is similar to that shown in FIGS. 6 and 7. In this integration structure, as is also apparent from FIG. 12, in addition to the basic structure of the above-described integration structure, the periphery of the integration structure is reinforced by a reinforcer 7. The material of the reinforcer 7 may be Si or various other metals, or a ceramic or the like.

Incidentally, it is ensured that the integration structure provided with the reinforcer 7 can have a far higher mechanical strength than the integration structure which consists of the base 3, the tray 4 and the contactor 5 as shown in FIG. 7 and others. The integration structure having the far higher mechanical strength ensured by the reinforcer 7 may be adopted, as required, in the case where, for example, the predetermined number N of LSI chips 1b to be rearranged in the interior of the integration structure is comparatively large so that if the LSI chips 1b are pressed in the burn-in step or the like after the integration step, a large bend or deformation easily occurs in the integration structure by a load applied at that time, or in the case where the mechanical strength of an integration structure has a problem in terms of the handling of the integration structure in a subsequent inspection step. Incidentally, it will be desirable that the reinforcer 7 be formed as thinly as possible in view of the case in which the reinforcer 7 may become an obstacle to a subsequent inspection step, in terms of the external dimensions of the integration structure or the thermal capacity of the entire integration structure or the like.

As described above in detail, according to the present invention, by utilizing the integration structure, it is possible to rearrange, integrate and collectively systematically process an adequate predetermined number of LSI chips from among a multiplicity of LSI chips separated by being cut out from a wafer, whereby it is possible to collectively process only a predetermined number of LSI chips without using conventional sockets in handling in a subsequent inspection step, particularly, in the process of ensuring electrical connection to the inspection system. Accordingly, the steps of semiconductor device manufacturing methods, particularly, inspection steps can be made simple and highly efficient, whereby it is possible to achieve practically extremely superior effects which reduce the costs of the inspection steps and lower the manufacturing costs of semiconductor devices to a further extent.

What is claimed is:

1. A jig to be used in a semiconductor device inspection method of inspecting semiconductor device chips obtained by forming a plurality of large-scale integrated circuits over the semiconductor wafer and cutting the semiconductor wafer into individual LSI chips, in which the method comprises the steps of:

rearranging said cut LSI chips and integrating a predetermined number N of LSI chips;

inspecting said number N of cut LSI chips; and screening to select LSI chips basis on an inspection result obtained in said inspecting step;

wherein said rearranging and integrating step is performed by using a jig for integration; and wherein said jig is formed of a material whose coefficient of thermal expansion is approximately equal to the LSI chips, and an accommodating portion for rearranging the predetermined number N of cut LSI chips is formed in part of said jig.

2. A jig to be used in a semiconductor device inspection method according to claim 1, wherein including a plate-shaped base formed of a material whose coefficient of thermal expansion is approximately equal to the LSI chips, and a tray which is disposed above said base and is formed of a material whose coefficient of thermal expansion is approximately equal to the LSI chips, openings for rearranging the predetermined number N of cut LSI chips being formed in said tray by the predetermined number N.

3. A jig to be used in a semiconductor device inspection method according to claim 2, wherein at least either one of said base and said tray is formed of silicon.

4. A jig to be used in a semiconductor device inspection method according to claim 2, wherein at least either one of said base and said tray is formed of aluminum nitride.

5. A jig to be used in a semiconductor device inspection method according to claim 2, wherein including a plate-shaped contactor to be disposed above said tray, one surface of said contactor being provided with probe portions to be respectively electrically connected to electrode portions of the predetermined number N of LSI chips rearranged in said jig, while the other surface of said contactor is provided with secondary electrodes to be respectively electrically connected to said probe portions.

6. A jig to be used in a semiconductor device inspection method according to claim 5, wherein said contactor is formed of silicon.

7. A jig to be used in a semiconductor device inspection method according to claim 5, wherein said contactor is formed of aluminum nitride.

8. A jig to be used in a semiconductor device inspection method according to claim 5, wherein said number N of secondary electrodes which are disposed over the other surface of said contactor are formed at a pitch of 0.5 mm to 1.5 mm.

9. A jig to be used in a step of inspection for a large-scale integrated circuit (LSI) chip having a main surface and a rear surface opposite from the main surface, the main surface having circuits formed thereon, the jig comprising:

openings with a size commensurate with the dimensions of the LSI chip so as to integrate the LSI chip in the jig such that the rear surface of each chip is in contact with the jig and the main surface is exposed for inspection;

an inspecting portion which contacts the main surface during inspection; and wherein at least on part of the jig having the openings has a coefficient of thermal expansion that is approximately equal to that of the LSI chip.

10. A jig to be used in a step of inspection for a semiconductor device having a main surface and a rear surface opposite from the main surface, the main surface having circuits formed thereon, the jig comprising:

openings with a size commensurate with the dimensions of the semiconductor device so as to integrate the semiconductor device in the jig such that the rear surface of each device is in contact with the jig and the main surface is exposed for inspection;

an inspecting portion which electrically contacts the circuits during inspection; and wherein at least on part of the jig having the openings has a coefficient of thermal expansion that is approximately equal to that of the semiconductor device.

* * * * *